United States Patent
Choi (10) Patent No.: US 7,884,783 B2
(45) Date of Patent: Feb. 8, 2011

(54) DATA DRIVER, ORGANIC LIGHT EMITTING DISPLAY, AND METHOD OF DRIVING THE SAME

(75) Inventor: Sang Moo Choi, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 1034 days.

(21) Appl. No.: 11/642,584

(22) Filed: Dec. 21, 2006

(65) Prior Publication Data

US 2007/0139313 A1    Jun. 21, 2007

(30) Foreign Application Priority Data

Dec. 21, 2005    (KR) ............... 10-2005-0127233

(51) Int. Cl.
*G09G 5/00* (2006.01)
(52) U.S. Cl. .................. 345/80; 345/212; 345/213; 345/210; 345/76; 345/61; 345/69; 345/98; 345/82; 341/144; 341/154; 341/145; 327/104; 315/169.3
(58) Field of Classification Search .......... 345/82, 345/76, 48, 98, 83, 211, 210, 212, 213, 61, 345/69, 208, 690, 204; 341/144, 154, 145; 327/104; 315/169.3
See application file for complete search history.

(56) References Cited

U.S. PATENT DOCUMENTS 5,059,978 A * 10/1991 Valdenaire .......... 341/145
5,389,872 A    2/1995 Erhart et al.
5,640,174 A    6/1997 Kamei et al.
5,703,588 A * 12/1997 Rivoir et al. ........ 341/159

(Continued)

FOREIGN PATENT DOCUMENTS

JP    03-098317 A    4/1991

(Continued)

OTHER PUBLICATIONS

Oborn, Patrick K., et al., "A new digital to analog converter resistor string architecture", ASIC Conference and Exhibit, 1997, Proceedings, 10th Annual IEEE International, Portland OR, USA, pp. 304-307 (Sep. 7-10, 1997).

*Primary Examiner*—Lun-Yi Lao
*Assistant Examiner*—Olga Merkoulova
(74) *Attorney, Agent, or Firm*—Lee & Morse, P.C.

(57) ABSTRACT

A data driver including a first digital-to-analog converter configured to select first and second reference voltages depending on upper bits of data and supply the first and the second reference voltages to a first line and a second line, respectively, a second digital-to-analog converter having the first line and the second line to receive the first and the second reference voltages, respectively, a first group of voltage dividing resistors between the first line and the second line and configured to generate a plurality of gray scale voltages, a voltage dividing resistor unit between the first line and the second line, and at least one switch positioned between the voltage dividing resistor unit and one of the first line and the second line, and including a decoder unit configured to control on and off state of the at least one switch depending on lower bits of data.

21 Claims, 7 Drawing Sheets

U.S. PATENT DOCUMENTS

| | | |
|---|---|---|
| 6,037,889 A | 3/2000 | Knee |
| 6,411,273 B1 * | 6/2002 | Nakamura et al. ............ 345/98 |
| 7,375,710 B2 | 5/2008 | Tobita |
| 7,403,145 B2 * | 7/2008 | Choi et al. .................. 341/144 |
| 7,573,454 B2 | 8/2009 | Morita |
| 2003/0090402 A1* | 5/2003 | Nagao ........................ 341/154 |
| 2004/0080474 A1* | 4/2004 | Kimura ....................... 345/82 |
| 2004/0174355 A1 | 9/2004 | Taguchi et al. |
| 2005/0140534 A1 | 6/2005 | Nishi et al. |

FOREIGN PATENT DOCUMENTS

| | | |
|---|---|---|
| JP | 11-202299 A | 7/1999 |
| JP | 2003-114415 A | 4/2003 |
| JP | 2004-029845 | 1/2004 |
| JP | 2004-295103 A | 10/2004 |
| JP | 2005-037746 A | 2/2005 |
| JP | 2005-084482 A | 3/2005 |
| JP | 2005-122214 A | 5/2005 |
| JP | 2005-208581 A | 8/2005 |
| JP | 2006-017858 A | 1/2006 |
| KR | 2004-0062052 | 7/2004 |
| KR | 2005-0116098 | 12/2005 |

* cited by examiner

DATA DRIVER, ORGANIC LIGHT EMITTING DISPLAY, AND METHOD OF DRIVING THE SAME

BACKGROUND OF THE INVENTION

1. Field of the Invention

The present invention relates to a data driver, an organic light emitting display, and a method of driving the same. More particularly, the present invention relates to a data driver for enhancing image quality, an organic light emitting display, and a method of driving the same.

2. Description of the Related Art

Various flat panel display devices having reduced weight and volume compared to comparable cathode ray tubes (CRTs) have been developed. These flat panel display devices include e.g., a liquid crystal display, a field emission display, a plasma display panel, an organic light emitting display, etc. These exemplary displays may operate differently to display an image.

For example, an organic light emitting display may display an image by using an organic light emitting diode that generates light by recombining electrons and holes. During operation, the organic light emitting display may supply a current corresponding to a data signal to organic light emitting diodes by employing driving, thin film transistors formed at each pixel so light may be emitted from the organic light emitting diodes. The organic light emitting display may offer certain advantages, since it may be operated with low power consumption and may provide a rapid response speed.

The organic light emitting display may generate data signals by using data supplied from an external source. The organic light emitting display may supply the generated data signals to pixels and display an image of desired brightness. A data driver for converting the data supplied from the external source into the data signals has been considered.

The data driver may include a data signal generator for converting the external data into the data signals. The data signal generator may include a digital-to-analog converter (hereinafter, referred to as "DAC"). The DAC may be positioned in each channel and may convert the data into the data signals. For example, the data signal generator may include first DACs for generating voltages depending on the values of the upper bits of the data and second DACs for generating voltages depending on the values of the lower bits of the data.

Figure 1:
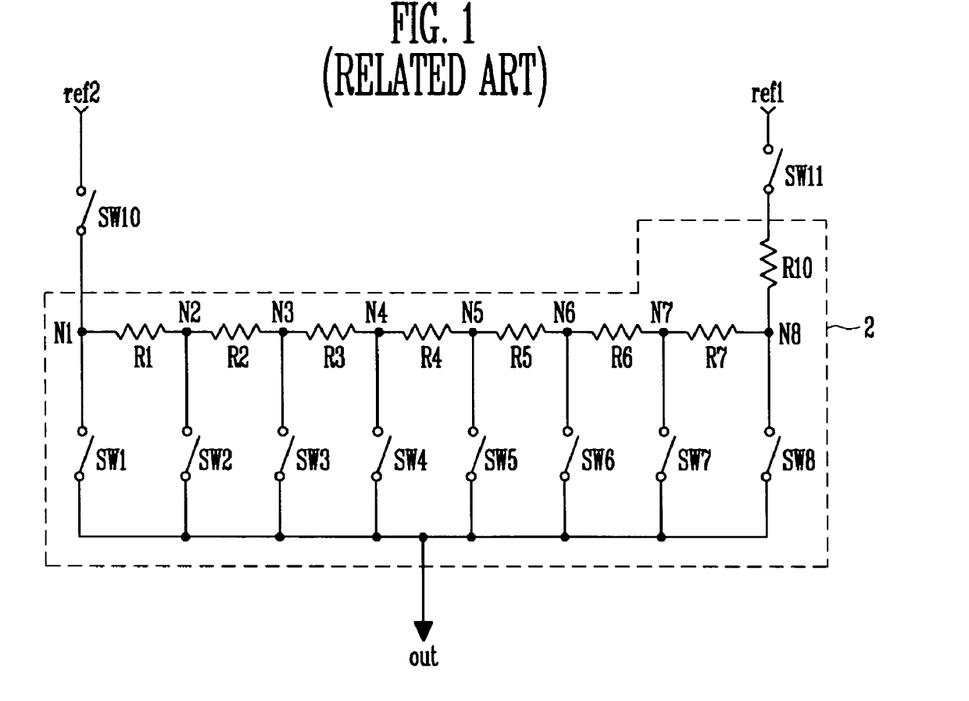
FIG. 1 illustrates a circuit diagram of a conventional second DAC.

FIG. 1 illustrates a circuit diagram of a second DAC. Referring to FIG. 1, the second DAC 2 may receive a first reference voltage (ref1) and a second reference voltage (ref2) from a first DAC (not illustrated). The first DAC may receive a plurality of reference voltages from an external source. The first DAC may select the first reference voltage (ref1) and the second reference voltage (ref2) among the plurality of reference voltages received depending on a value of the upper bits of the data. The first DAC may supply the selected first and second reference voltages (ref1) and (ref2) to the second DAC 2 via a tenth switch SW10 and an eleventh switch SW11, as illustrated in FIG. 1. That is, the tenth switch SW10 or the eleventh switch SW11 included in the first DAC may be turned on depending on the value of the upper bits of the data. For the sake of discussion, the present invention will be described assuming that the first reference voltage (ref1) is lower than the second reference voltage (ref2).

The second DAC 2 may include a plurality of voltage dividing resistors R1 to R7 for dividing the voltage values of the first reference voltage (ref1) and the second reference voltage (ref2). The second DAC 2 may also include a plurality of switches SW1 to SW8 for supplying voltages divided from the voltage dividing resistors R1 to R7 to an output terminal (out).

A tenth resistor R10 may be arranged between the eleventh switch SW11 and the seventh resistor R7. The tenth resistor R10 may compensate for the switch resistances of the tenth switch SW10 and the eleventh switch SW11 so that the second DAC may evenly divide the reference voltages via the voltage dividing resistors R1 to R7.

The voltage dividing resistors R1 to R7 may be arranged in series. The voltage dividing resistors R1 to R7 may evenly divide the first reference voltage (ref1) and the second reference voltage (ref2). In this regard, the resistance value of each of the voltage dividing resistors R1 to R7 may be identical.

The switches SW1 to SW8 may be arranged to supply the voltages divided by the voltage dividing resistors R1 to R7 to the output terminal (out). In particular, the first switch SW1 may be arranged between a first node N1 and the output terminal (out) to supply the second reference voltage (ref2) to the output terminal (out). The second switch SW2 may be arranged between a second node N2 and the output terminal (out) to supply the voltage value of the second node N2 to the output terminal (out). The third switch SW3 may be arranged between a third node N3 and the output terminal (out) to supply the voltage value of the third node N3 to the output terminal (out). The fourth switch SW4 may be arranged between a fourth node N4 and the output terminal (out) to supply the voltage value of the fourth node N4 to the output terminal (out). The fifth switch SW5 may be arranged between a fifth node N5 and the output terminal (out) to supply the voltage value of the fifth node N5 to the output terminal (out). The sixth switch SW6 may be arranged between a sixth node N6 and the output terminal (out) to supply the voltage value of the sixth node N6 to the output terminal (out). The seventh switch SW7 may be arranged between a seventh node N7 and the output terminal (out) to supply the voltage value of the seventh node N7 to the output terminal (out). The eighth switch SW8 may be arranged between an eighth node N8 and the output terminal (out) to supply the first reference voltage (ref1) to the output terminal (out).

During operation, one of the switches SW1 to SW8 may be turned on depending on the value of the lower bits of the data, and a predetermined voltage may be supplied to the output terminal (out). The predetermined voltage value supplied to the output terminal (out) may be supplied to pixels as a data signal.

The conventional second DAC 2 may exhibit a deterioration of its driving ability when supplying a gray scale voltage, such as an intermediate gray scale voltage (e.g., voltages of node N4 or node N5) as a data signal. In other words, since the intermediate gray scale voltage is supplied to the output terminal (out) via a plurality of resistors, a period of time is required before intermediate gray scale voltages corresponding to the data signals may be supplied to the pixels. For example, some intermediate gray scale voltages (e.g., voltages of node N1, node N2, node N6 and node N7) adjacent to the first reference voltage (ref1) and the second reference voltage (ref2) may be supplied and charged in the pixels within a shorter period of time than other intermediate gray scale voltages (e.g., voltages of node N4 or node N5).

Figure 2:
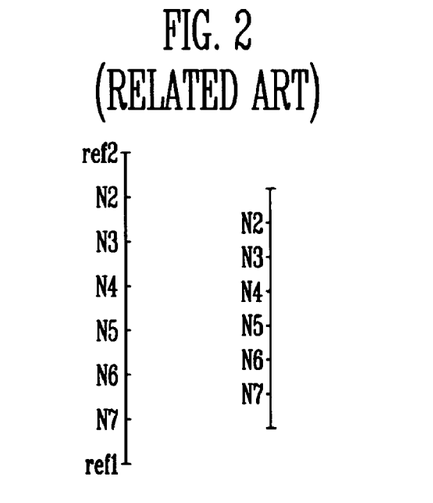
FIG. 2 illustrates a diagram of an alteration of gray scale voltage levels due to voltage drop.

In order to resolve this deficiency, it has been proposed to lower the resistance values of the voltage dividing resistors R1 to R7 between the first reference voltage ref1 and the second reference voltage ref2. It may be understood that if the resistance value between the first reference voltage (ref1) and the second reference voltage (ref2) is lowered, the driving ability of the intermediate gray scale may be enhanced. That is, it may be possible to supply and charge the pixels with a predetermined voltage within a predetermined time period. However, if the resistance value between the first reference voltage (ref1) and the second reference voltage (ref2) is lowered, the value of constant current flowing into the voltage dividing resistors R1 to R7 may increase. This increase in the value of constant current flowing may generate a phenomenon known as voltage drop. If voltage drop is generated, the voltage values of the intermediate gray scale voltages adjacent to the first reference voltage (ref1) and the second reference voltage (ref2) may be altered, as illustrated in FIG. 2. Thus, the predetermined voltage may not be supplied and charged in the pixels. The voltage values of the intermediate gray scale voltages more centered between the first reference voltage (ref1) and the second reference voltage (ref2) may maintain approximately similar values, regardless of the voltage drop.

As discussed above, a conventional organic light emitting display may operate with certain deficiencies. That is, if the resistance values of the voltage dividing resistors R1 to R7 between the first reference voltage (ref1) and the second reference voltage (ref2) are large, the driving ability of the intermediate gray scale may be deteriorated, and if the resistance values of the voltage dividing resistors R1 to R7 are small, the gray scale voltage values adjacent to the first reference voltage (ref1) and the second reference voltage (ref2) may be altered.

SUMMARY OF THE INVENTION

The present invention is therefore directed to a data driver, an organic light emitting display, and a method of driving the same that substantially overcome one or more of the problems due to the limitations and disadvantages of the related art.

It is therefore a feature of an exemplary embodiment of the present invention to provide a data driver and an organic light emitting display that includes a second DAC configured to enhance image quality.

It is therefore another feature of an exemplary embodiment of the present invention to provide a data driver and an organic light emitting display that includes a second DAC configured to enhance the driving ability of a data driver.

It is therefore another feature of an exemplary embodiment of the present invention to provide a data driver and an organic light emitting display that includes a second DAC that reduces the occurrence of voltage drop.

At least one of the above and other features and advantages of the present invention may be realized by providing a data driver including a first digital-to-analog converter configured to select first and second reference voltages from a plurality of reference voltages depending on upper bits of data and supply the selected first and second reference voltages to a first line and a second line, respectively, a second digital-to-analog converter having the first line and the second line configured to receive the first and the second reference voltages, respectively, a first group of voltage dividing resistors between the first line and the second line, the first group of voltage dividing resistors configured to generate a plurality of gray scale voltages by dividing the first reference voltage and the second reference voltage, a voltage dividing resistor unit between the first line and the second line, and at least one switch between the voltage dividing resistor unit and one of the first line and the second line, and a decoder unit configured to control on and off states of the at least one switch depending on lower bits of data.

The decoder unit may be configured to control the on and off state of the at least one switch so that, when a gray scale voltage between the first reference voltage and the second reference voltage is output, a resistance value between the first line and the second line may be set lower than a resistance value between the first line and the second line when either of the first reference voltage and the second reference voltage is output. The decoder unit may be configured to control the on and off state of the at least one switch so that the resistance value between the first line and the second line may be correspondingly set lower as the gray scale voltage to be output increasingly differs from the first reference voltage to a predetermined gray scale voltage. The decoder unit may be configured to control the on and off state of the at least one switch so that the resistance value between first line and the second line may be correspondingly set lower as the gray scale voltage to be output increasingly differs from the second reference voltage to a predetermined gray scale voltage.

The data driver may further include a first group of switches between nodes of the first voltage dividing resistors and an output terminal, the first group of switches controlled by the decoder unit and configured to supply a divided voltage to the output terminal.

The voltage dividing resistor unit may include a second group of voltage dividing resistors, a third group of voltage dividing resistors, a fourth group of voltage dividing resistors, and a fifth group of voltage dividing resistors, wherein the second, third, fourth and fifth groups of voltage dividing resistors may be respectively between the first line and the second line. The at least one switch may include a second switch between the second group of voltage dividing resistors and one of the first line and the second line, a third switch between the third group of voltage dividing resistors and one of the first line and the second line, a fourth switch between the fourth group of voltage dividing resistors and one of the first line and the second line, and a fifth switch between the fifth group of voltage dividing resistors and one of the first line and the second line.

The data driver may further include a second group of switches between nodes of the first voltage dividing resistors and corresponding nodes of the second voltage dividing resistors, the second group of switches configured to be turned on simultaneously with the second switch, a third group of switches between nodes of the second voltage dividing resistors and corresponding nodes of the third voltage dividing resistors, the third group of switches configured to be turned on simultaneously with the third switch, a fourth group of switches between nodes of the third voltage dividing resistors and corresponding nodes of the fourth voltage dividing resistors, the fourth group of switches configured to be turned on simultaneously with the fourth switch, and a fifth group of switches between nodes of the fourth voltage dividing resistors and corresponding nodes of the fifth voltage dividing resistors, the fifth group of switches configured to be turned on simultaneously with the fifth switch.

The number of resistors respectively included in the second group of voltage dividing resistors, the third group of voltage dividing resistors, the fourth group of voltage dividing resistors and the fifth group of voltage dividing resistors may be identical to the number of resistors included in the first group of voltage dividing resistors.

The data driver may further include a shift register unit configured to supply sampling signals in sequence, a sampling latch unit configured to store data in response to the sampling signals, a holding latch unit configured to store data from the sampling latch unit, and a data signal generator configured to receive data from the holding latch unit and generate data signals, wherein each channel of the data signal generator may include the first digital-to-analog converter and the second digital-to-analog converter. The data driver may further include a level shifter between the holding latch unit and the data signal generator, the level shifter configured to increase a voltage level of the data, and a buffer unit configured to receive data signals from the data signal generator.

At least one of the above and other features and advantages of the present invention may be realized by providing an organic light emitting display including a pixel unit including a plurality of pixels connected to scan lines and data lines, a scan driver configured to drive the scan lines, and a data driver configured to drive the data lines, wherein the data driver includes a first digital-to-analog converter configured to select first and second reference voltages from a plurality of reference voltages depending on upper bits of data and supply the selected first and second reference voltages to a first line and a second line, respectively, a second digital-to-analog converter having the first line and the second line configured to receive the first and the second reference voltages, respectively a first group of voltage dividing resistors between the first line and the second line, the first group of voltage dividing resistors configured to generate a plurality of gray scale voltages by dividing the first reference voltage and the second reference voltage a voltage dividing resistor unit between the first line and the second line, and at least one switch between the voltage dividing resistor unit and one of the first line and the second line, and a decoder unit configured to control on and off states of the at least one switch depending on lower bits of data.

The decoder unit may be configured to control the on and off state of the at least one switch so that, when a gray scale voltage between the first reference voltage and the second reference voltage is output, a resistance value between the first line and the second line may be set lower than a resistance value between the first line and the second line when either of the first reference voltage and the second reference voltage is output. The decoder unit may be configured to control the on and off state of the at least one switch so that the resistance value between the first line and the second line may be correspondingly set lower as the gray scale voltage to be output increasingly differs from the first reference voltage to a predetermined gray scale voltage. The decoder unit may be configured to control the on and off state of the at least one switch so that the resistance value between first line and the second line may be correspondingly set lower as the gray scale voltage to be output increasingly differs from the second reference voltage to a predetermined gray scale voltage.

The organic light emitting display may further include a first group of switches between nodes of the first voltage dividing resistors and an output terminal, the first group of switches controlled by the decoder unit and configured to supply a divided voltage to the output terminal.

The voltage dividing resistor unit may include a second group of voltage dividing resistors, a third group of voltage dividing resistors, a fourth group of voltage dividing resistors, and a fifth group of voltage dividing resistors, wherein the second, third, fourth and fifth groups of voltage dividing resistors may be respectively between the first line and the second line. The at least one switch may include a second switch between the second group of voltage dividing resistors and one of the first line and the second line, a third switch between the third group of voltage dividing resistors and one of the first line and the second line, a fourth switch between the fourth group of voltage dividing resistors and one of the first line and the second line, and a fifth switch between the fifth group of voltage dividing resistors and one of the first line and the second line.

The organic light emitting display may further include a second group of switches between nodes of the first voltage dividing resistors and corresponding nodes of the second voltage dividing resistors, the second group of switches configured to be turned on simultaneously with the second switch, a third group of switches between nodes of the second voltage dividing resistors and corresponding nodes of the third voltage dividing resistors, the third group of switches configured to be turned on simultaneously with the third switch, a fourth group of switches between nodes of the third voltage dividing resistors and corresponding nodes of the fourth voltage dividing resistors, the fourth group of switches configured to be turned on simultaneously with the fourth switch, and a fifth group of switches between nodes of the fourth voltage dividing resistors and corresponding nodes of the fifth voltage dividing resistors, the fifth group of switches configured to be turned on simultaneously with the fifth switch.

At least one of the above and other features and advantages of the present invention may further be realized by providing a method of driving an organic light emitting display including supplying first and second reference voltages of a plurality of reference voltages to a first line and a second line, respectively, depending on upper bits of data, dividing the first and the second reference voltages into a plurality of gray scale voltages by controlling a resistance value between the first line and the second line depending on lower bits of data, and outputting a gray scale voltage.

Dividing may include, when outputting a gray scale voltage that is between the first and the second reference voltages, setting the resistance value between the first line and the second line to be lower than the resistance value when outputting a gray scale voltage that is either of the first and the second reference voltages. The resistance value between the first line and the second line may be correspondingly set lower as the gray scale voltage to be output increasingly differs from the first reference voltage to a predetermined gray scale voltage. The resistance value between the first line and the second line may be correspondingly set lower as the gray scale voltage to be output increasingly differs from the second reference voltage to a predetermined gray scale voltage.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2005-0127233, filed on Dec. 21, 2005, in the Korean Intellectual Property Office, and entitled: "Data Driver and Driving Method of Organic Light Emitting Display Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

Hereinafter, exemplary embodiments according to the present invention will be described with reference to the accompanying FIGS. 3 to 7.

Figure 3:
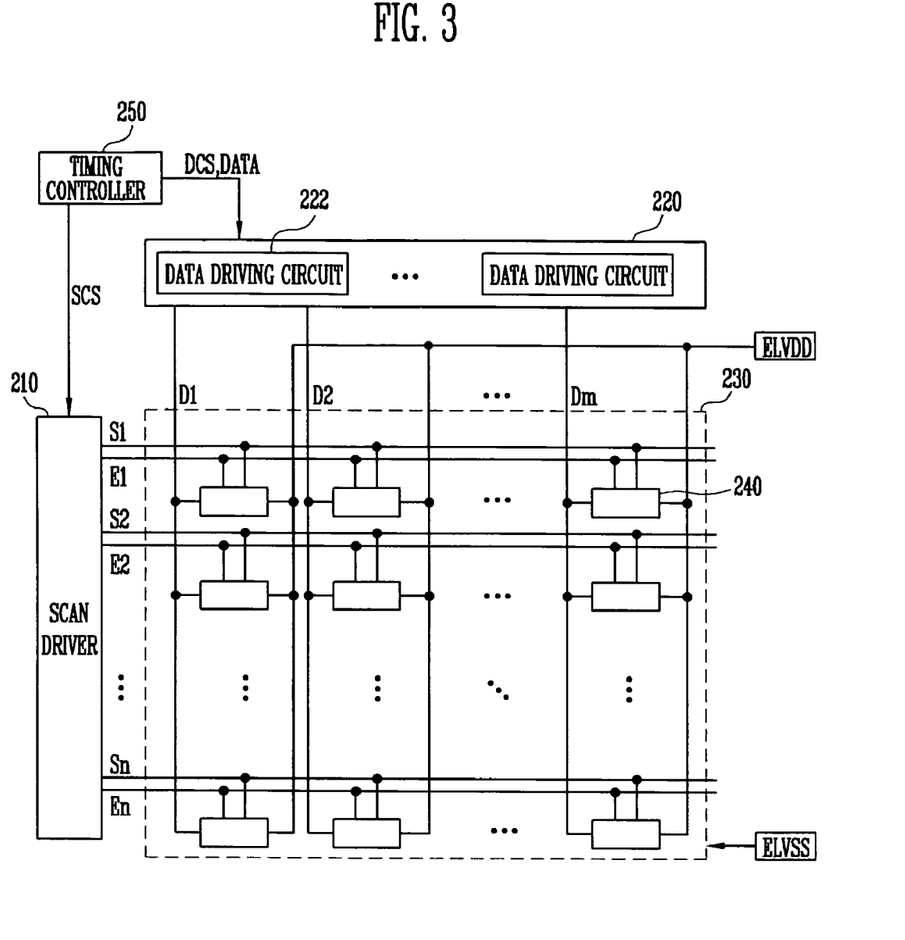
FIG. 3 illustrates a block circuit diagram of an organic light emitting display according to an exemplary embodiment of the present invention.

FIG. 3 illustrates a block circuit diagram of an organic light emitting display according to an exemplary embodiment of the present invention. Referring to FIG. 3, the organic light emitting display may include a pixel unit 230 including pixels 240 formed on a region where scan lines S1 to Sn are intersected with data lines D1 to Dm, a scan driver 210 for driving scan lines S1 to Sn, a data driver 220 for driving data lines D1 to Dm, and a timing controller 250 for controlling the scan driver 210 and the data driver 220. The data driver 220 may include at least one data driving circuit 222.

The scan driver 210 may generate scan signals in response to scan driving control signals SCS from the timing controller 250. The scan driver 210 may supply the generated scan signals to the scan lines S1 to Sn in sequence. The scan driver 210 may generate light emitting control signals in response to the scan driving control signals SCS. The scan driver may supply the generated light emitting control signals to light emitting control lines E1 to En in sequence.

The data driver 220 may generate data signals in response to data driving control signals DCS from the timing controller 250. The data driver 220 may supply the generated data signals to the data lines D1 to Dm in sequence. The data driving circuit 222 may convert data supplied from an external source into data signals and supply the data signals to the data lines D1 to Dm. The data driving circuit 222 will be described in more detail below.

The timing controller 250 may generate a data driving control signal DCS and a scan driving control signal SCS depending on synchronization signals supplied from an external source. The data driving control signal DCS and the scan driving control signal SCS generated from the timing controller 250 may be supplied to the data driver 220 and to the scan driver 210, respectively. The timing controller 250 may rearrange the data supplied from the external source and supply the rearranged data DATA to the data driver 220.

The pixel unit 230 may receive a first power source ELVDD and a second power source ELVSS from an external source. The first power source ELVDD and the second power source ELVSS may be supplied to the pixel unit 230, and may be respectively supplied to the pixels 240. The pixels 240 receiving the first power source ELVDD and the second power source ELVSS may display images corresponding to data signals supplied from the data driving circuit 222.

Figure 4A:
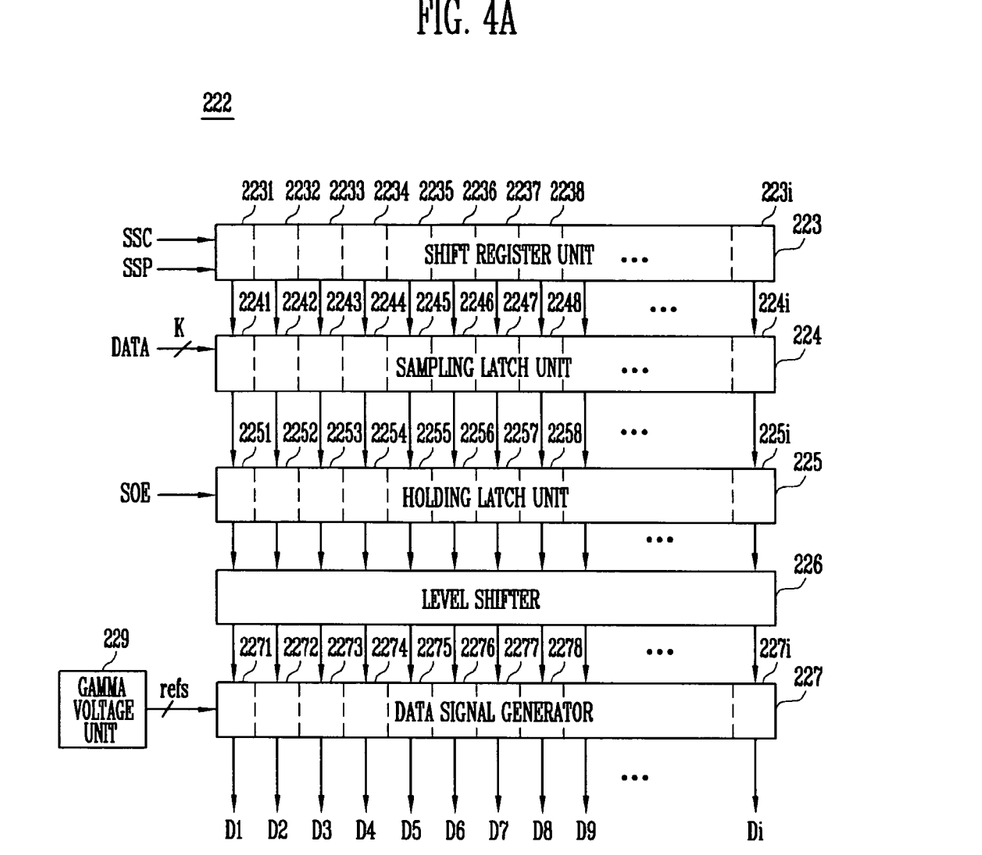
FIG. 4A and FIG. 4B illustrate block circuit diagrams of an exemplary data driving circuit illustrated in FIG. 3.

FIG. 4A illustrates a block circuit diagram of an exemplary data driving circuit illustrated in FIG. 3. For the sake of discussion, FIG. 4A will be described assuming that the data diving circuit 222 includes "i" channels.

Referring to FIG. 4A, the data driving circuit 222 may include the following: a shift register unit 223 for supplying sampling signals in sequence, a sampling latch unit 224 for storing data DATA in sequence in response to the sampling signals, a holding latch unit 225 for temporarily storing data stored in the sampling latch unit 224 and supplying the stored data to a level shifter 226, a level shifter 226 for raising a voltage level of the data, and a data signal generator 227 for generating data signals corresponding to bit values of data.

The shift register unit 223 may receive a source shift clock SSC and a source start pulse SSP from the timing controller 250. The shift register unit 223 receiving the source shift clock SSC and the source start pulse SSP may generate "i" sampling signals in sequence, while allowing the source start pulse SSP to be shifted depending on the source shift clock SSC. The shift register unit 223 may include "i" shift registers 2231 to 223$i$.

The sampling latch unit 224 may store data in sequence depending on the sampling signals supplied in sequence from the shift register unit 223. The sampling latch unit 224 may include "i" sampling latches 2241 to 224$i$ for storing "i" data. Each size of the sampling latches 2241 to 224$i$ may be set to store k bit data. For the sake of discussion, this exemplary sampling latch unit 224 will be described assuming that k bit is 6 bits.

The holding latch unit 225 may receive and store the data from the sampling latch unit 224 in response to a source output enable SOE signal. The holding latch unit 225 may supply the stored data to a level shifter 226. The holding latch unit 225 may include "i" holding latches 2251 to 225$i$. Each of the holding latches 2251 to 225$i$ may be configured to store k bit data.

The level shifter 226 may raise a voltage level of the data supplied from the holding latch unit 225. The level shifter 226 may supply the data with a raised voltage level to the data signal generator 227. In this regard, the data driver 220 may receive data having a low voltage level and may raise the voltage level of the data to a high voltage level by employing the level shifter 226.

In other implementations, the data driver 220 may not include the level shifter 226. For example, circuit components necessary to raise the voltage level of the data from a low voltage level to a high voltage level may be arranged external to the data driver 220. Accordingly, the holding latch unit 225 may be directly connected to the data signal generator 227. In such an arrangement, however, manufacturing costs may be increased.

The data signal generator 227 may generate data signals corresponding to bit values (or gray scale values) of the data. The data signal generator 227 may supply the generated data signals to the data lines D1 to Di. The data signal generator 227 may receive a plurality of reference voltages (refs) from a gamma voltage unit 229. The data signal generator may generate data signals by using the received reference voltages (refs). The data signal generator 227 will be described in more detail below.

The gamma voltage unit 229 may supply the plurality of reference voltages (refs) to the data signal generator 227. The gamma voltage unit 229 may be arranged inside or outside of the data driving circuit 222.

Figure 4B:
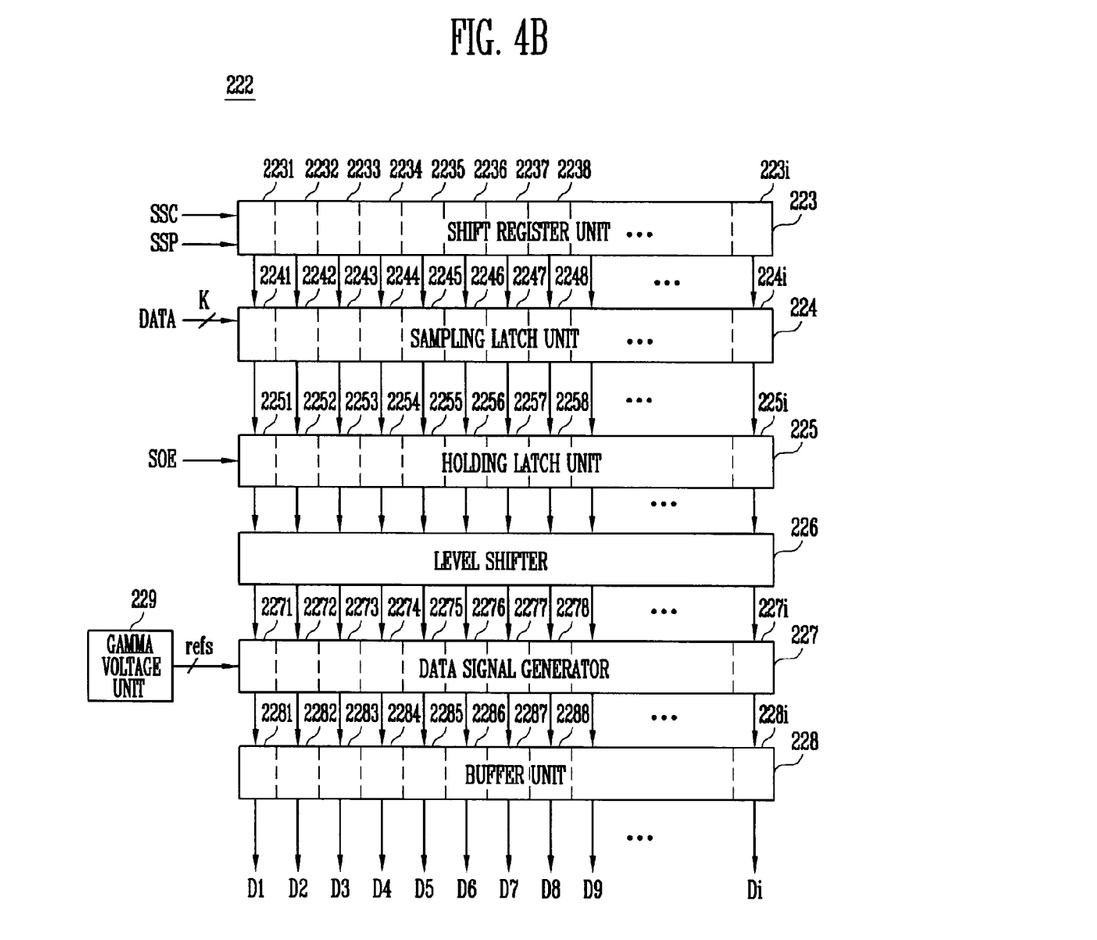

Referring to FIG. 4B, a buffer unit 228 may be connected between the data signal generator 227 and the data lines D1 to Di. The buffer unit 228 may supply the data signals supplied from the data signal generator 227 to the data lines D1 to Di.

Figure 5:
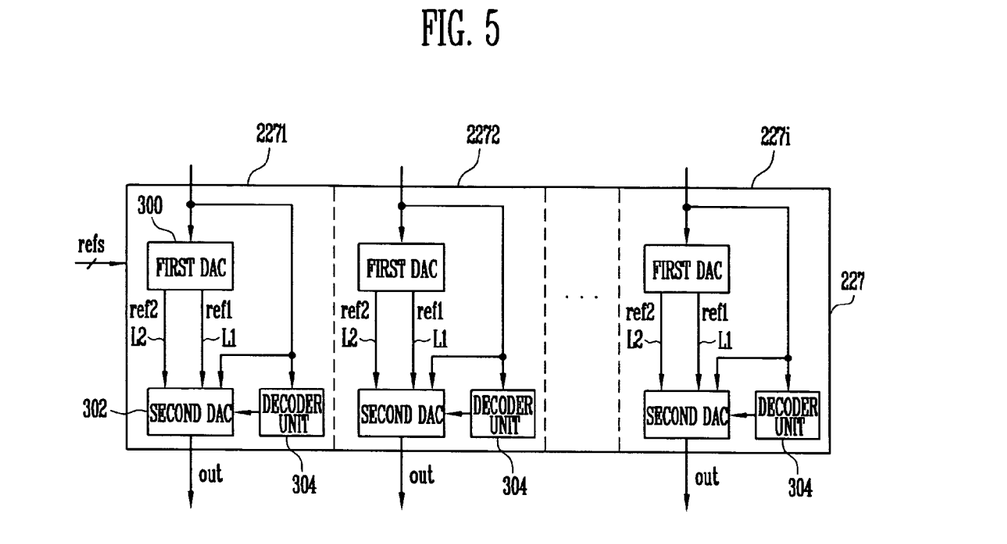
FIG. 5 illustrates a block circuit diagram of an exemplary data signal generator illustrated in FIGS. 4A and 4B.

FIG. 5 illustrates a block circuit diagram of an exemplary data signal generator as illustrated in FIGS. 4A and 4B. Referring to FIG. 5, the data signal generator 227 may include, for each channel, a first DAC 300, a second DAC 302 and a decoder unit 304.

The first DAC 300 may receive the plurality of reference voltages (ref) from a gamma unit 229. The first DAC 300 may select a first reference voltage (ref1) and a second reference voltage (ref2) from the plurality of reference voltages (refs) depending on, e.g., a value of upper bits of the data. The first DAC 300 may receive the data from the level shifter 226, or directly from the holding latch unit 225, depending on the implementation.

The first DAC 300 may supply the first reference voltage (ref1) and the second reference voltage (ref2) to the second DAC 302 via a first line L1 and a second line L2, respectively. That is, the first DAC 300 may extract two reference voltages from the plurality of reference voltages (refs) depending on the value of the upper bits. The first DAC 300 may supply the extracted two reference voltages to the second DAC 302 as the first reference voltage (ref1) and the second reference voltage (ref2). For the sake of discussion, it will be assumed that the first reference voltage (ref1) is set to be lower than the second reference voltage (ref2).

The second DAC 302 may divide the first reference voltage (ref1) and the second reference voltage (ref2) into a plurality of voltages. The second DAC 302 may supply any one of the first reference voltage (ref1), the second reference voltage (ref2) and the divided voltages to the output terminal (out) as a data signal, depending on a value of the lower bits of the data.

The decoder unit 304 may control the turning on and the turning off of switches included in the second DAC 302 depending on the value of the lower bits of the data. That is, the decoder unit 304 may control the turning on and the turning off of the switches so that a resistance value between the first line L1 and the second line L2 can be variably controlled depending on the value of the lower bits of the data.

Figure 6:
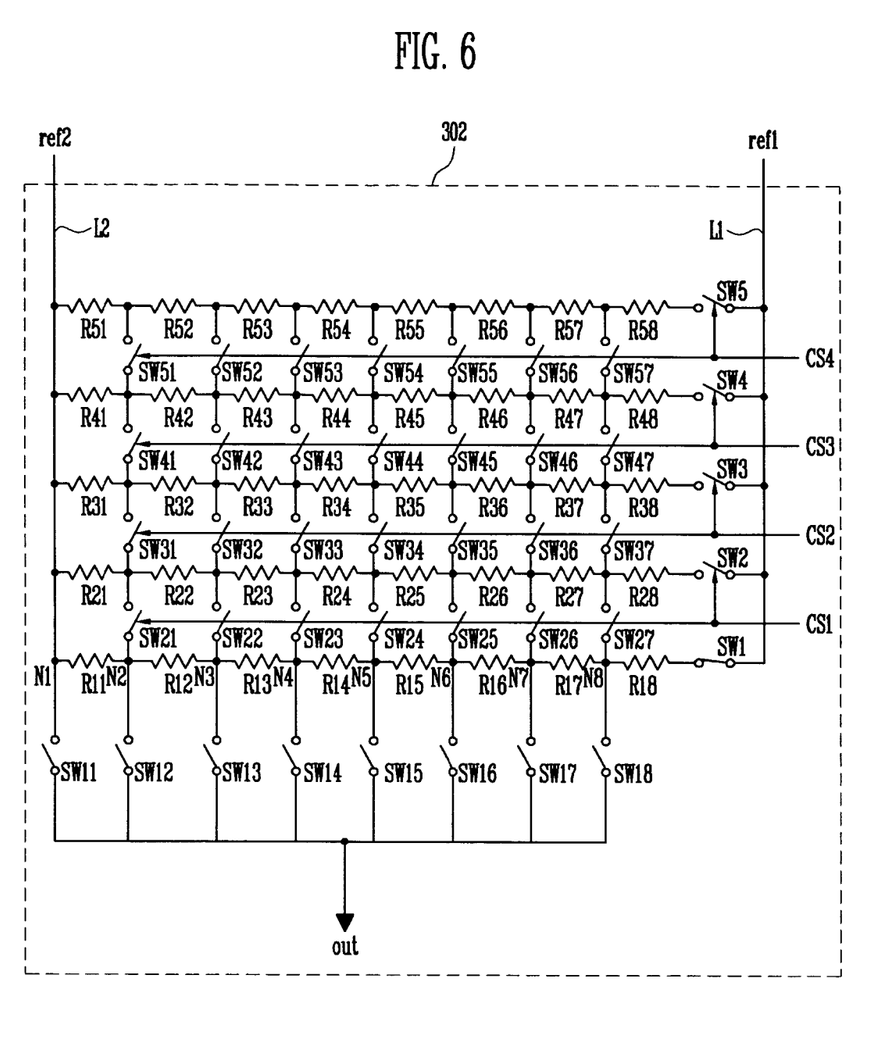
FIG. 6 illustrates a circuit diagram of a second DAC according to a first exemplary embodiment of the present invention.

FIG. 6 illustrates a circuit diagram of a second DAC according to a first exemplary embodiment of the present invention. Referring to FIG. 6, the second DAC 302 may include a first group of voltage dividing resistors R11 to R18, a second group of voltage dividing resistors R21 to R28, a third group of voltage dividing resistors R31 to R38, a fourth group of voltage dividing resistors R41 to R48, and a fifth group of voltage dividing resistors R51 to R58, which may be all arranged between the first line L1 and the second line L2. Also, the second DAC 302 may include an arrangement of switches. The switches will be described in more detail below.

The first group of voltage dividing resistors R11 to R18 may be arranged between the first line L1 and the second line L2 in series. The first group of voltage dividing resistors R11 to R18 may divide the voltages of the first reference voltage (ref1) and the second reference voltage (ref2). The resistance values of the first group of voltage dividing resistors R11 to R18 may be identical so that the first reference voltage (ref1) and the second reference voltage (ref2) may be evenly divided.

A first switch SW1 may be arranged between the first group of voltage dividing resistors R11 to R18 and the first line L1. The first switch SW1 may allow the first group of voltage dividing resistors R11 to R18 to be electrically connected to the first line L1 and may remain in a turned on state. The first switch SW1 may be arranged in order to compensate for the turn on resistances of a second switch SW2, a third switch SW3, a fourth switch SW4, and a fifth switch SW5, which will be described below.

The second group of voltage dividing resistors R21 to R28 may be arranged in parallel with the first group of voltage dividing resistors R11 to R18, and may be between the first line L1 and the second line L2. The number resistors in the second group of voltage dividing resistors R21 to R28 may be identical to the number of resistors in the first group of voltage dividing resistors R11 to R18. The second switch SW2 may be arranged between the second group of voltage dividing resistors R21 to R28 and the first line L1.

During an exemplary operation, a first control signal CS1 may be supplied from the decoder unit 304, and the second switch SW2 may be turned on. When the second switch SW2 is turned on, the second group of voltage dividing resistors R21 to R28 may be electrically connected to the first line L1. If the second group of voltage dividing resistors R21 to R28 is connected to the first line L1, the resistance value between the first line L1 and the second line L2 may become lower than the case when only the first group of voltage dividing resistors R11 to R18 is electrically connected to first line L1 and the second line L2.

The third group of voltage dividing resistors R31 to R38 may be arranged in parallel with the second group of voltage dividing resistors R21 to R28, and may be between the first line L1 and the second line L2. The number of resistors in the third group of voltage dividing resistors R31 to R38 may be identical to the number of resistors in the first group of voltage dividing resistors R11 to R18. The third switch SW3 may be arranged between the third group of voltage dividing resistors R31 to R38 and the first line L1.

During an exemplary operation, a second control signal CS2 may be supplied from the decoder unit 304, and the third switch SW3 may be turned on. When the third switch SW3 is turned on, the third group of voltage dividing resistors R31 to R38 may be electrically connected to the first line L1. If the third group of voltage dividing resistors R31 to R38 is connected to the first line L1, the resistance value between the first line L1 and the second line L2 may become even lower than the case when the first group of voltage dividing resistors R11 to R18 and the second group of voltage dividing resistors R21 to R28 are electrically connected to the first line L1.

The fourth group of voltage dividing resistors R41 to R48 may be arranged in parallel with the third group of voltage dividing resistors R31 to R38, and may be between the first line L1 and the second line L2. The number of resistors in the fourth group of voltage dividing resistors R41 to R48 may be identical to the number of resistors in the first group of voltage dividing resistors R11 to R18. The fourth switch SW4 may be arranged between the fourth group of voltage dividing resistors R41 to R48 and the first line L1.

During an exemplary operation, a third control signal CS3 may be supplied from the decoder unit 304, and the fourth switch SW4 may be turned on. When the fourth switch SW4 is turned on, the fourth group of voltage dividing resistors R41 to R48 may be electrically connected to the first line L1. If the fourth group of voltage dividing resistors R41 to R48 is connected to the first line L1, the resistance value between the first line L1 and the second line L2 may become even lower than the case when the first voltage group of dividing resistors R11 to R18, the second group of voltage dividing resistors R21 to R28, and the third group of voltage dividing resistors R31 to R38 are electrically connected to the first line L1.

The fifth group of voltage dividing resistors R51 to R58 may be arranged in parallel with the fourth group of voltage dividing resistors R41 to R48, and may be between the first line L1 and the second line L2. The number of resistors in the fifth group of voltage dividing resistors R51 to R58 may be identical to the number of resistors in the first group of voltage dividing resistors R11 to R18. The fifth switch SW5 may be arranged between the fifth group of voltage dividing resistors R51 to R58 and the first line L1.

During an exemplary operation, a fourth control signal CS4 may be supplied from the decoder unit 304, and the fifth switch SW5 may be turned on. When the fifth switch SW5 is turned on, the fifth group of voltage dividing resistors R51 to R58 may be electrically connected to the first line L1. If the fifth group of voltage dividing resistors R51 to R58 is connected to the first line L1, the resistance value between the first line L1 and the second line L2 may become even lower than the case when the first group of voltage dividing resistors R11 to R18, the second group of voltage dividing resistors R21 to R28, the third group of voltage dividing resistors R31 to R38 and the fourth group of voltage dividing resistors R41 to R48 are electrically connected to the first line L1.

For the sake of discussion, FIG. 6 illustrates four voltage dividing resistor columns R21 to R28, R31 to R38, R41 to R48, and R51 to R58 that are arranged in parallel to the first group of voltage dividing resistors R11 to R18; however the present invention is not limited thereto. However, one or more voltage dividing resistor columns may be in parallel with the first group of voltage dividing resistors R11 to R18.

The second DAC 302 may include a first group of switches SW11 to SW18, a second group of switches SW21 to SW27, a third group of switches SW30 to SW37, a fourth group of switches SW41 to SW47, and a fifth group of switches SW51 to SW57. The first group of switches SW11 to SW18 may be arranged at each node of the first group of voltage dividing resistors R11 to R18. The first group of switches SW11 to SW18 may supply the voltage divided in the first group of voltage dividing resistors R11 to R18 to the output terminal (out).

In particular, an eleventh switch SW11 may be arranged between a first node N1 and an output terminal (out) and may supply the second reference voltage (ref2) to the output terminal (out). A twelfth switch SW12 may be arranged between a second node N2 and the output terminal (out) and may supply the voltage of the second node N2 to the output terminal (out). A thirteenth switch SW13 may be arranged between a third node N3 and the output terminal (out) and may supply the voltage of the third node N3 to the output terminal (out). A fourteenth switch SW14 may be arranged between a fourth node N4 and the output terminal (out) and may supply the voltage of the fourth node N4 to the output terminal (out). A fifteenth switch SW15 may be arranged between a fifth node N5 and the output terminal (out) and supply the voltage of the fifth node N5 to the output terminal (out). A sixteenth switch SW16 may be arranged between a sixth node N6 and the output terminal (out) and may supply the voltage of the sixth node N6 to the output terminal (out). A seventeenth switch SW17 may be arranged between a seventh node N7 and the output terminal (out) and may supply a voltage of the seventh node N7 to the output terminal (out). An eighteenth switch SW18 may be arranged between an eighth node N8 and the output terminal (out) and may supply the first reference voltage (ref1) to the output terminal (out).

The decoder unit 304 may control the turning on and the turning off of the first group of switches SW11 to SW18 depending on the lower bits of the data. In other words, the decoder unit 304 may allow any one of the first group of switches SW11 to SW18 to be turned on depending on the lower bits of the data, and the turned on switch may supply a predetermined voltage value to the output terminal (out). The voltage value supplied to the output terminal (out) may be supplied to pixels 240 as a data signal. In another implementation, the data signal may be supplied to the pixels 240 via the buffer unit 228.

The second group of switches SW21 to SW27 may be arranged between nodes of the first group of voltage dividing resistors R11 to R18 and corresponding nodes of the second group of voltage dividing resistors R21 to R28. The second group of switches SW21 to SW27 may be turned on simultaneously with the second switch SW2, in response to the first control signal CS1 supplied from the decoder unit 304. Nodes of the first group of voltage dividing resistors R11 to R18 and corresponding nodes of the second group of voltage dividing resistors R21 to R28 may be electrically connected by the respective switches of the second group of switches SW21 to SW27.

The third group of switches SW31 to SW37 may be arranged between nodes of the second group of voltage dividing resistors R21 to R28 and corresponding nodes of the third group of voltage dividing resistors R31 to R38. The third group of switches SW31 to SW37 may be turned on simultaneously with the third switch SW3 in response to the second control signal CS2 supplied from the decoder unit 304. Nodes of the second group of voltage dividing resistors R21 to R28 and corresponding nodes of the third group of voltage dividing resistors R31 to R38 may be electrically connected by the respective switches of the third group of switches SW31 to SW37.

The fourth group of switches SW41 to SW47 may be arranged between nodes of the third group of voltage dividing resistors R31 to R38 and corresponding nodes of the fourth group of voltage dividing resistors R41 to R48. The fourth group of switches SW41 to SW47 may be turned on simultaneously with the fourth switch SW4 in response to the third control signal CS3 supplied from the decoder unit 304. Nodes of the third group of voltage dividing resistors R31 to R38 and corresponding nodes of the fourth group of voltage dividing resistors R41 to R48 may be electrically connected by the respective switches of the fourth group of switches SW41 to SW47.

The fifth group of switches SW51 to SW57 may be arranged between nodes of the fourth group of voltage dividing resistors R41 to R48 and corresponding nodes of the fifth group of voltage dividing resistors R51 to R58. The fifth group of switches SW51 to SW57 may be turned on simultaneously with the fifth switch SW5 in response to the fourth control signal CS4 supplied from the decoder unit 304. Nodes of the fourth group of voltage dividing resistors R41 to R48 and corresponding nodes of the fifth group of voltage dividing resistors R51 to R58 may be electrically connected by the respective switches of the fifth group of switches SW51 to SW57.

An operation of the second DAC 302 according to this embodiment of the present invention will be described in detail with reference to FIG. 6 and Table 1, below.

TABLE 1

| Data | | | Switches | | | | | | | | | | | |
| --- | --- | --- | --- | --- | --- | --- | --- | --- | --- | --- | --- | --- | --- | --- |
| D2 | D1 | D0 | SW11 | SW12 | SW13 | SW14 | SW15 | SW16 | SW17 | SW18 | SW2 | SW3 | SW4 | SW5 |
| 0 | 0 | 0 | ON | OFF | OFF | OFF | OFF | OFF | OFF | OFF | OFF | OFF | OFF | OFF |
| 0 | 0 | 1 | OFF | ON | OFF | OFF | OFF | OFF | OFF | OFF | ON | OFF | OFF | OFF |
| 0 | 1 | 0 | OFF | OFF | ON | OFF | OFF | OFF | OFF | OFF | ON | ON | OFF | OFF |
| 0 | 1 | 1 | OFF | OFF | OFF | ON | OFF | OFF | OFF | OFF | ON | ON | ON | OFF |
| 1 | 0 | 0 | OFF | OFF | OFF | OFF | ON | OFF | OFF | OFF | ON | ON | ON | ON |
| 1 | 0 | 1 | OFF | OFF | OFF | OFF | OFF | ON | OFF | OFF | ON | ON | ON | OFF |
| 1 | 1 | 0 | OFF | OFF | OFF | OFF | OFF | OFF | ON | OFF | ON | ON | OFF | OFF |
| 1 | 1 | 1 | OFF | OFF | OFF | OFF | OFF | OFF | OFF | ON | ON | OFF | OFF | OFF |

Table 1 illustrates a diagram of the on and off states of the switches controlled by the decoder unit 304. For the sake of discussion, the number of lower bits of data is 3. However, it will be appreciated that other numbers of lower bits may be used.

The decoder unit 304 may turn on the eleventh switch SW11 when a lower 3 bits "000" may be input. The second reference voltage (ref2) may be supplied to the first node N1 and output to the output terminal (out) via the eleventh switch SW11. The second reference voltage (ref2) may then be supplied to the pixels 240 as the data signal. When the second reference voltage (ref2) is supplied to the output terminal (out), only the first group of voltage dividing resistors R11 to R18 is connected between the first line L1 and the second line L2. Thus, a high resistance may be set between the first line L1 and the second line L2. That is, when the second reference voltage (ref2) is output, the resistance value between the first line L1 and the second line L2 may be set high, thereby making it to possible to prevent the generation of voltage drop, since a value of the constant current may be low and the resistance may be high.

When a lower 3 bits "100" may be input (e.g., to output an intermediate gray scale voltage), the decoder unit 304 may turn on the second switch SW2, the third switch SW3, the fourth switch SW4, the fifth switch SW5 and the fifteenth switch SW15.

If the second switch SW2, the third switch SW3, the fourth switch SW4 and the fifth switch SW5 are turned on, the second group of voltage dividing resistors R21 to R28, the third group of voltage dividing resistors R31 to R38, the fourth group of voltage dividing resistors R41 to R48 and the fifth group of voltage dividing resistors R51 to R58 may be connected to the first group of voltage dividing resistors R11 to R18 in parallel. Thus, when the second group of voltage dividing resistors R21 to R28, the third group of voltage dividing resistors R31 to R38, the fourth group of voltage dividing resistors R41 to R48 and the fifth group of voltage dividing resistors R51 to R58 are connected to the first group of voltage dividing resistors R11 to R18 in parallel, the resistance value between the first line L1 and the second line L2 is set even lower compared to the resistance value when the lower 3 bits "000" are input and the second reference voltage (ref2) is output.

In detail, when the decoder unit 304 supplies the second control signal CS1 to the second switch SW2, the second group of switches SW21 to SW27 may be turned on simultaneously. Similarly, when the decoder, unit 304 supplies the second control signal CS2, the third control signal CS3, and the fourth control signal CS4 to the third switch SW3, the fourth switch SW4, and the fifth switch SW5, respectively, the third group of switches SW31 to SW37, the fourth group of switches SW41 to SW47, and the fifth group of switches SW51 to SW57 may be turned on simultaneously. Thus, nodes between the corresponding first to fifth groups of voltage dividing resistors R11 to R18, R21 to R28, R31 to R38, R41 to R48, and R51 to 58 may be electrically connected.

Additionally, if the fifteenth switch SW15 is turned on, the voltage applied to the fifth node N5 may be supplied to the output terminal (out) as a data signal. That is, when the lower 3 bits "100" are input, the intermediate gray scale voltage may be supplied to the output terminal (out). Accordingly, the resistance value between the first line L1 and the second line L2 may be set even lower than the resistance value when the second reference voltage (ref2) is output. Therefore, by lowering the resistance between the first line L1 and the second line L2, the charging speed of the pixels 240 may be enhanced when an intermediate gray scale voltage is output as the data signal.

When expressing gray scale voltages corresponding to inputs "001," "010" and "011," between "000" to "100," the resistance value between the first line L1 and the second line L2 may be set correspondingly lower in sequence. Thus, the gray scale voltage may be supplied to the output terminal (out) by setting the resistance between the first line L1 and the second line L2 to a correspondingly lower value in sequence from the second reference voltage (ref2) to an intermediate gray scale voltage.

More particularly, when "001" is input as the lower 3 bits, the first group of voltage dividing resistors R11 to R18 and the second group of voltage dividing resistors R21 to R28 may be connected in parallel, and the resistance value may be lower than when "000" is input. When "010" is input as the lower 3 bits, the first group of voltage dividing resistors R11 to R18, the second group of voltage dividing resistors R21 to R28, and the third group of voltage dividing resistors R31 to R38 may be connected in parallel, and the resistance value may be even lower than when "001" is input. Also, when "011" is input as the lower 3 bits, the first group of voltage dividing resistors R11 to R18, the second group of voltage dividing resistors R21 to R28, the third group of voltage dividing resistors R31 to R38, and the fourth group of voltage dividing resistors R41 to R48 may be connected in parallel, and the resistance value may be even lower than when "010" is input.

In the same manner, the decoder unit 304 supplies the gray scale voltage via the second DAC 304 by setting the resistance between the first line L1 and the second line L2 to be sequentially lowered from the first reference voltage (ref1) to an intermediate gray scale voltage.

That is, in a sequence similar to that just described, when "111" is input as the lower 3 bits, the first group of voltage dividing resistors R11 to R18 and the second group of voltage dividing resistors R21 to R28 may be connected in parallel. When "110" is input as the lower 3 bits, the first group of voltage dividing resistors R11 to R18, the second group of voltage dividing resistors R21 to R28, and the third group of voltage dividing resistors R31 to R38 may be connected in parallel, and the resistance value may be lower than when "111" is input. Also, when "101" is input as the lower 3 bits, the first group of voltage dividing resistors R11 to R18, the second group of voltage dividing resistors R21 to R28, the third group of voltage dividing resistors R31 to R38, and the fourth group of voltage dividing resistors R41 to R48 may be connected in parallel, and the resistance value may be lower than when "110" is input.

Figure 7:
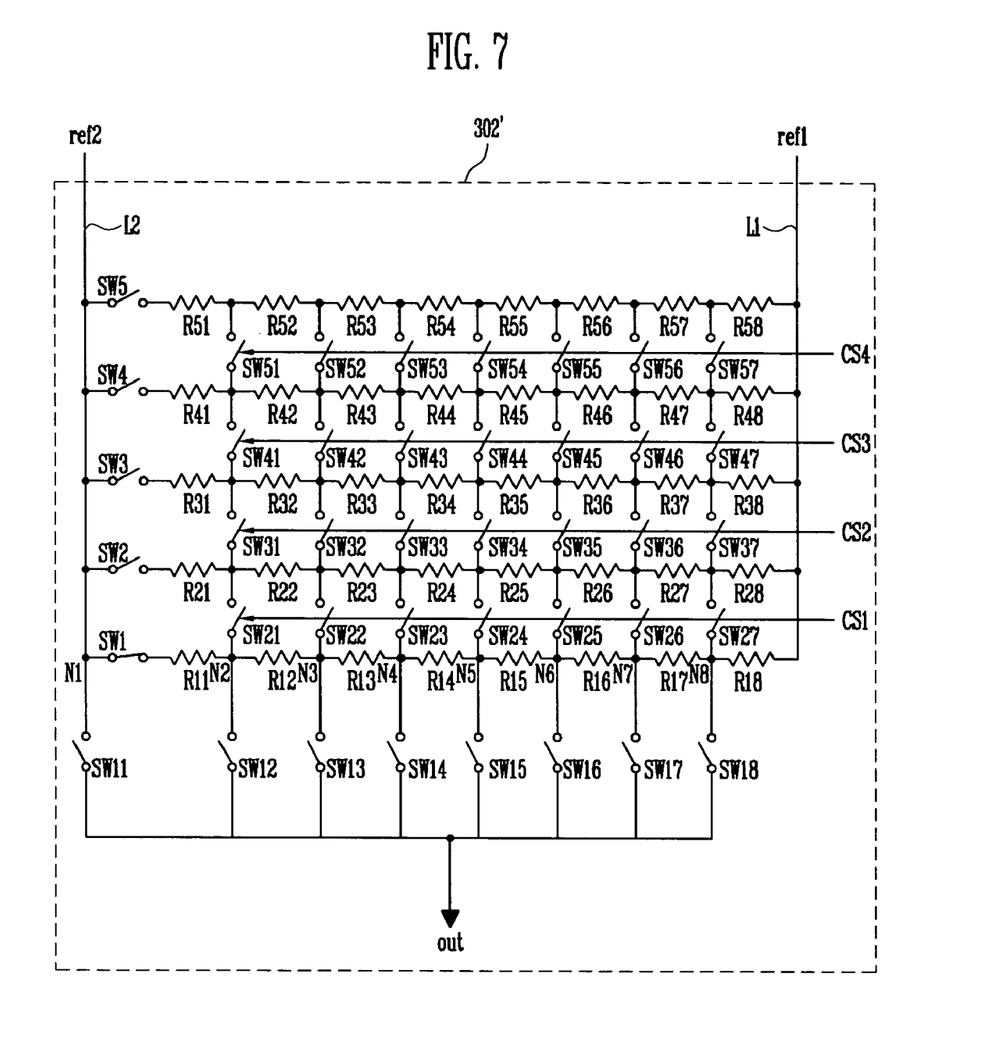
FIG. 7 illustrates a circuit diagram of a second DAC according to a second exemplary embodiment of the present invention.

FIG. 7 illustrates a circuit diagram of a second DAC according to a second exemplary embodiment of the present invention. In the following description, a detailed description of elements included in the second DAC 302' that are identical to those previously described in FIG. 6 will not be repeated.

Referring to FIG. 7, the first switch SW1 may be arranged between the first group of voltage dividing resistors R11 to R18 and the second line L2. The second switch SW2 may be arranged between the second group of voltage dividing resistors R21 to R28 and the second line L2. The third switch SW3 may be arranged between the third group of voltage dividing resistors R31 to R38 and the second line L2. The fourth switch SW4 may be arranged between the fourth group of voltage dividing resistors R41 to R48 and the second line L2. The fifth switch SW5 may be arranged between the fifth group of voltage dividing resistors R51 to R58 and the second line L2.

Although the positions of the first to the fifth switches SW1 to SW5 may be changed, the driving process therein may be identical to the driving process of the first embodiment of the present invention, as illustrated in FIG. 6. Accordingly, a detailed description of the driving process will not be repeated.

As described above, a data driver, an organic light emitting display, and a method of driving the same according to the present invention may set the resistance value between the first line and the second line to be high when outputting the first reference voltage and the second reference voltage. Also, the resistance value between the first line and the second line may be low when outputting the intermediate gray scale voltage, which is between the first reference voltage and the second reference voltage. Thus, the present invention may enable charging of the intermediate gray scale voltage to the pixels within a short period of time, so as to enhance the driving ability. Additionally, the resistance value between the first line and the second line may be set correspondingly lower as the gray scale voltage to be output increasingly differs from the first reference voltage to an intermediate gray scale voltage, which may enable generation of the data signal without voltage drop. Also, the resistance value between the first line and the second line may be set correspondingly lower as the gray scale voltage to be output increasingly differs from the second reference voltage to the intermediate gray scale voltage, which may enable generation of the data signal without voltage drop.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A data driver, comprising:
a first digital-to-analog converter configured to select first and second reference voltages from a plurality of reference voltages depending on upper bits of data and supply the selected first and second reference voltages to a first line and a second line, respectively;
a second digital-to-analog converter having:
the first line and the second line configured to receive the first and the second reference voltages, respectively;
a first group of voltage dividing resistors, the first group of voltage dividing resistors having resistors connected in series between the first line and the second line, the first group of voltage dividing resistors dividing the first reference voltage and the second reference voltage to generate a plurality of gray scale voltages;
a voltage dividing resistor unit, the voltage dividing resistor unit including a second group of voltage dividing resistors, the second group of voltage dividing resistors having resistors connected in series between the first line and the second line; and
at least one switch between the voltage dividing resistor unit and one of the first line and the second line, the at least one switch including a second switch that corresponds to the second group of voltage dividing resistors, the second switch being configured to connect the second group of voltage dividing resistors in parallel with the first group of voltage dividing resistors between the first line and the second line; and
a first group of switches, switches of the first group of switches being respectively connected between nodes of the first voltage dividing resistors and an output terminal, the first group of switches being controlled by the decoder unit and configured to supply a divided voltage to the output terminal;
a second group of switches, switches of the second group of switches being respectively connected between the nodes of the first voltage dividing resistors and corresponding nodes of the second voltage dividing resistors, the second group of switches being configured to be turned on simultaneously with the second switch; and
a decoder unit configured to control on and off states of the at least one switch depending on lower bits of data.

2. The data driver as claimed in claim 1, wherein the decoder unit is configured to control the on and off state of the at least one switch so that, when a gray scale voltage between the first reference voltage and the second reference voltage is output, a resistance value between the first line and the second line is set lower than a resistance value between the first line and the second line when either of the first reference voltage and the second reference voltage is output.

3. The data driver as claimed in claim 2, wherein the decoder unit is configured to control the on and off state of the at least one switch so that the resistance value between the first line and the second line is correspondingly set lower as the gray scale voltage to be output increasingly differs from the first reference voltage to a predetermined gray scale voltage.

4. The data driver as claimed in claim 2, wherein the decoder unit is configured to control the on and off state of the at least one switch so that the resistance value between first line and the second line is correspondingly set lower as the gray scale voltage to be output increasingly differs from the second reference voltage to a predetermined gray scale voltage.

5. The data driver as claimed in claim 1, wherein the voltage dividing resistor unit includes:
the second group of voltage dividing resistors,
a third group of voltage dividing resistors, the third group of voltage dividing resistors having resistors connected in series between the first line and the second line, a fourth group of voltage dividing resistors, the fourth group of voltage dividing resistors having resistors connected in series between the first line and the second line, and a fifth group of voltage dividing resistors, the fifth group of voltage dividing resistors having resistors connected in series between the first line and the second line, wherein the second, third, fourth and fifth groups of voltage dividing resistors are configured to be connected in parallel between the first line and the second line.

6. The data driver as claimed in claim 5, wherein the at least one switch includes:

the second switch, the second switch being between the second group of voltage dividing resistors and one of the first line and the second line;

a third switch between the third group of voltage dividing resistors and one of the first line and the second line;

a fourth switch between the fourth group of voltage dividing resistors and one of the first line and the second line; and a fifth switch between the fifth group of voltage dividing resistors and one of the first line and the second line.

7. The data driver as claimed in claim 6, further comprising:

a third group of switches in the voltage dividing unit, the third group of switches being between nodes of the second voltage dividing resistors and corresponding nodes of the third voltage dividing resistors, the third group of switches configured to be turned on simultaneously with the third switch;

a fourth group of switches in the voltage dividing unit, the fourth group of switches being between nodes of the third voltage dividing resistors and corresponding nodes of the fourth voltage dividing resistors, the fourth group of switches configured to be turned on simultaneously with the fourth switch; and a fifth group of switches in the voltage dividing unit, the fifth group of switches being between nodes of the fourth voltage dividing resistors and corresponding nodes of the fifth voltage dividing resistors, the fifth group of switches configured to be turned on simultaneously with the fifth switch.

8. The data driver as claimed in claim 5, wherein the number of resistors respectively included in the second group of voltage dividing resistors, the third group of voltage dividing resistors, the fourth group of voltage dividing resistors and the fifth group of voltage dividing resistors is identical to the number of resistors included in the first group of voltage dividing resistors.

9. The data driver as claimed in claim 1, further comprising:

a shift register unit configured to supply sampling signals in sequence;

a sampling latch unit configured to store data in response to the sampling signals;

a holding latch unit configured to store data from the sampling latch unit; and a data signal generator configured to receive data from the holding latch unit and generate data signals, wherein each channel of the data signal generator includes the first digital-to-analog converter and the second digital-to-analog converter.

10. The data driver as claimed in claim 9, further comprising:

a level shifter between the holding latch unit and the data signal generator, the level shifter configured to increase a voltage level of the data; and a buffer unit configured to receive data signals from the data signal generator.

11. An organic light emitting display, comprising:

a pixel unit including a plurality of OLED pixels connected to scan lines and data lines;

a scan driver configured to drive the scan lines; and a data driver configured to drive the data lines, wherein the data driver includes:

a first digital-to-analog converter configured to select first and second reference voltages from a plurality of reference voltages depending on upper bits of data and supply the selected first and second reference voltages to a first line and a second line, respectively;

a second digital-to-analog converter having:

the first line and the second line configured to receive the first and the second reference voltages, respectively;

a first group of voltage dividing resistors, the first group of voltage dividing resistors having resistors connected in series between the first line and the second line, the first group of voltage dividing resistors configured to generate a plurality of gray scale voltages by dividing the first reference voltage and the second reference voltage;

a voltage dividing resistor unit, the voltage dividing resistor unit including a second group of voltage dividing resistors, the second group of voltage dividing resistors having resistors connected in series between the first line and the second line; and at least one switch between the voltage dividing resistor unit and one of the first line and the second line, the at least one switch including a second switch that corresponds to the second group of voltage dividing resistors, the second switch being configured to connect the second group of voltage dividing resistors in parallel with the first group of voltage dividing resistors between the first line and the second line; and a first group of switches, switches of the first group of switches being respectively connected between nodes of the first voltage dividing resistors and an output terminal, the first group of switches being controlled by the decoder unit and configured to supply a divided voltage to the output terminal;

a second group of switches, switches of the second group of switches being respectively connected between the nodes of the first voltage dividing resistors and corresponding nodes of the second voltage dividing resistors, the second group of switches being configured to be turned on simultaneously with the second switch; and a decoder unit configured to control on and off states of the at least one switch depending on lower bits of data.

12. The organic light emitting display as claimed in claim 11, wherein the decoder unit is configured to control the on and off state of the at least one switch so that, when a gray scale voltage between the first reference voltage and the second reference voltage is output, a resistance value between the first line and the second line is set lower than a resistance value between the first line and the second line when either of the first reference voltage and the second reference voltage is output.

13. The organic light emitting display as claimed in claim 12, wherein the decoder unit is configured to control the on and off state of the at least one switch so that the resistance value between the first line and the second line is correspondingly set lower as the gray scale voltage to be output increasingly differs from the first reference voltage to a predetermined gray scale voltage.

14. The organic light emitting display as claimed in claim 12, wherein the decoder unit is configured to control the on and off state of the at least one switch so that the resistance value between first line and the second line is correspondingly set lower as the gray scale voltage to be output increasingly differs from the second reference voltage to a predetermined gray scale voltage.

15. The organic light emitting display as claimed in claim 11, wherein the voltage dividing resistor unit includes:
the second group of voltage dividing resistors,
a third group of voltage dividing resistors,
a fourth group of voltage dividing resistors, and
a fifth group of voltage dividing resistors,
wherein the second, third, fourth and fifth groups of voltage dividing resistors are respectively between the first line and the second line.

16. The organic light emitting display as claimed in claim 15, wherein the at least one switch includes:
the second switch, the second switch being between the second group of voltage dividing resistors and one of the first line and the second line;
a third switch between the third group of voltage dividing resistors and one of the first line and the second line;
a fourth switch between the fourth group of voltage dividing resistors and one of the first line and the second line; and
a fifth switch between the fifth group of voltage dividing resistors and one of the first line and the second line.

17. The organic light emitting display as claimed in claim 16, further comprising:
a third group of switches between nodes of the second voltage dividing resistors and corresponding nodes of the third voltage dividing resistors, the third group of switches configured to be turned on simultaneously with the third switch;
a fourth group of switches between nodes of the third voltage dividing resistors and corresponding nodes of the fourth voltage dividing resistors, the fourth group of switches configured to be turned on simultaneously with the fourth switch; and
a fifth group of switches between nodes of the fourth voltage dividing resistors and corresponding nodes of the fifth voltage dividing resistors, the fifth group of switches configured to be turned on simultaneously with the fifth switch.

18. A method of driving an organic light emitting display, comprising:
supplying first and second reference voltages of a plurality of reference voltages to a first line and a second line, respectively, depending on upper bits of data;
dividing the first and the second reference voltages into a plurality of gray scale voltages by controlling a resistance value between the first line and the second line depending on lower bits of data, controlling the resistance value between the first line and the second line including:
connecting a first group of serially-connected voltage dividing resistors and a second group of serially-connected voltage dividing resistors in parallel between the first line and the second line using a second switch configured to connect the second group of voltage dividing resistors to one of the first line and the second line;
supplying a divided voltage to an output from a first group of switches, switches of the first group of switches being respectively connected between nodes of the first voltage dividing resistors and the output, the first group of switches being controlled depending on the lower bits of data and
connecting the nodes of the first group of voltage dividing resistors with corresponding nodes of the second group of voltage dividing resistors using a second group of switches, switches of the second group of switches being respectively connected between the nodes of the group of first voltage dividing resistors and the corresponding nodes of the second group voltage dividing resistors, the second group of switches being configured to be turned on simultaneously with the second switch; and
outputting a gray scale voltage.

19. The method as claimed in claim 18, wherein dividing comprises, when outputting a gray scale voltage that is between the first and the second reference voltages, setting the resistance value between the first line and the second line to be lower than the resistance value when outputting a gray scale voltage that is either of the first and the second reference voltages.

20. The method as claimed in claim 19, wherein the resistance value between the first line and the second line is correspondingly set lower as the gray scale voltage to be output increasingly differs from the first reference voltage to a predetermined gray scale voltage.

21. The method as claimed in claim 19, wherein the resistance value between the first line and the second line is correspondingly set lower as the gray scale voltage to be output increasingly differs from the second reference voltage to a predetermined gray scale voltage.

* * * * *